(12) United States Patent
Kim et al.

(10) Patent No.: US 7,821,311 B2
(45) Date of Patent: Oct. 26, 2010

(54) DELAY LOCKED LOOP CIRCUIT AND MEMORY DEVICE HAVING THE SAME

(75) Inventors: Yong-Ju Kim, Ichon-shi (KR); Sung-Woo Han, Ichon-shi (KR); Hee-Woong Song, Ichon-shi (KR); Ic-Su Oh, Ichon-shi (KR); Hyung-Soo Kim, Ichon-shi (KR); Tae-Jin Hwang, Ichon-shi (KR); Hae-Rang Choi, Ichon-shi (KR); Ji-Wang Lee, Ichon-shi (KR); Jae-Min Jang, Ichon-shi (KR); Chang-Kun Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/346,614

(22) Filed: Dec. 30, 2008

(65) Prior Publication Data

US 2010/0090736 A1 Apr. 15, 2010

(30) Foreign Application Priority Data

Oct. 13, 2008 (KR) ...................... 10-2008-0100255

(51) Int. Cl.
*H03L 7/06* (2006.01)
(52) U.S. Cl. ...................................... 327/158; 327/149
(58) Field of Classification Search ................. 327/147, 327/149, 156, 158
See application file for complete search history.

(56) References Cited

U.S. PATENT DOCUMENTS

| | | | |
|---|---|---|---|
| 4,996,596 A * | 2/1991 | Hirao et al. .................. 348/542 |
| 6,219,397 B1 * | 4/2001 | Park ........................... 375/376 |
| 6,310,498 B1 * | 10/2001 | Larsson ....................... 327/158 |
| 6,373,911 B1 * | 4/2002 | Tajima et al. ................ 375/375 |
| 6,686,784 B2 * | 2/2004 | Chang ......................... 327/157 |
| 6,690,243 B1 * | 2/2004 | Henrion .................. 331/117 R |
| 6,809,567 B1 * | 10/2004 | Kim et al. .................... 327/160 |
| 7,242,733 B2 * | 7/2007 | Iwata .......................... 375/355 |
| 2002/0047738 A1 * | 4/2002 | Kamihara ................... 327/237 |
| 2003/0117195 A1 * | 6/2003 | Chang ......................... 327/159 |
| 2003/0155953 A1 | 8/2003 | Hirata et al. |
| 2007/0121773 A1 * | 5/2007 | Kuan et al. .................. 375/376 |
| 2008/0094109 A1 | 4/2008 | Farjad-rad et al. |

FOREIGN PATENT DOCUMENTS

JP 2000-357951 12/2000

\* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A DLL circuit includes a multiphase clock signal generating unit configured to produce a plurality of multiphase clock signals by delaying a reference clock signal for a unit delay time and to produce an enable signal that is enabled when one of the plurality of the multiphase clock signals synchronizes with the reference clock signal at a frequency, and a multiphase clock signal selecting unit configured to delay one of the plurality of the multiphase clock signals for a predetermined time in response to a first control signal, to compare a phase of a delayed multiphase clock signal with a phase of the reference clock signal, and to output one of the plurality of the multiphase clock signals as a delayed clock signal, wherein a phase of the delayed clock signal synchronizes with the phase of the reference clock signal when the enable signal is enabled.

28 Claims, 3 Drawing Sheets

DELAY LOCKED LOOP CIRCUIT AND MEMORY DEVICE HAVING THE SAME

CROSS-REFERENCES TO RELATED APPLICATION

The present application claims priority under 35 U.S.C. 119(a) to Korean application number 10-2008-0100255, filed on Oct. 13, 2008, in the Korean Intellectual Property Office, which is incorporated herein by reference in its entirety as if set forth in full.

BACKGROUND

1. Technical Field

The embodiments described herein relate to a delay locked loop (DLL) circuit, and more particularly, to a DLL circuit to produce a multiphase clock signal and a memory device having the same.

2. Related Art

In general, in a synchronous dynamic random access memory (DRAM) device, a phase locked loop (PLL) circuit and a delay locked loop (DLL) circuit are employed to produce a clock signal having multiphases. The PLL and DLL circuits produce an internal clock signal that is converted into a reference clock signal in phase with the internal clock signal by a predetermine time. Accordingly, the PLL and DLL circuits output data in synchronization with an external clock signal, wherein the reference clock signal is obtained by converting the external clock signal.

Since the PLL circuit requires significant amounts of time to lock onto a specific frequency of an incoming signal, i.e., a phase locking operation, large amounts of current are consumed. Furthermore, since the phase locking operation includes a filter that requires a high capacitance to obtain a stable operation in the PLL circuit, a relatively large circuit area is needed.

The DLL circuit is commonly used much more than the PLL circuit because of jitter characteristics. Particularly, in a high-speed semiconductor memory apparatus, the DLL circuit that produces a multiphase clock signal is essentially required. In order to produce the multiphase clock signal, two loop circuits are required. A first loop circuit is referred to as a reference loop, wherein the multiphase clock signal is produced through the reference loop. A second loop circuit produces a delayed clock signal, which is synchronization with an external clock signal, by combining phases of the multiphase clock signals from the reference loop. Since the reference loop is also made up of another DLL circuit, locking time is relatively long and current consumption increases. Furthermore, since the DLL circuit locks onto a signal having a clock period as much as N times larger than an incoming signal by using a voltage controlled delay line, a harmonic locking problem can be issued due to the restriction of the locking range.

SUMMARY

A DLL circuit capable of producing multiphase clock signals and a memory device having reduced current consumption is described herein.

In one aspect, a DLL circuit includes a multiphase clock signal generating unit configured to produce a plurality of multiphase clock signals by delaying a reference clock signal for a unit delay time and to produce an enable signal that is enabled when one of the plurality of the multiphase clock signals synchronizes with the reference clock signal at a frequency, and a multiphase clock signal selecting unit configured to delay one of the plurality of the multiphase clock signals for a predetermined time in response to a first control signal, to compare a phase of a delayed multiphase clock signal with a phase of the reference clock signal, and to output one of the plurality of the multiphase clock signals as a delayed clock signal, wherein a phase of the delayed clock signal synchronizes with the phase of the reference clock signal when the enable signal is enabled.

In another aspect, a DLL circuit includes a voltage controlled oscillator configured to receive a bias voltage and to produce a plurality of multiphase clock signals by delaying a clock signal for a unit delay time, the clock signal is oscillated at substantially a same frequency as a reference clock signal, a delay clock signal generating unit configured to receive the plurality of the multiphase clock signals and to produce a delayed clock signal in response to a first control signal, a delay model configured to receive and delay the delayed clock signal for a predetermined time and to produce a feedback clock signal, and a DLL control unit configured to produce the bias voltage by comparing a phase of the reference clock signal with a phase of one of the multiphase clock signals at a frequency and to produce the first control signal by comparing the feedback clock signal with the reference clock signal.

In another aspect, a memory device includes a DLL circuit having a multiphase clock signal generating unit and a multiphase clock signal selecting unit, wherein the multiphase clock signal generating unit produces a plurality of multiphase clock signals and an enable signal that is enabled when one of the plurality of the multiphase clock signals synchronizes with a reference clock signal at a frequency, and wherein the multiphase clock signal selecting unit delays one of the plurality of the multiphase clock signals for a predetermined time to output a delayed clock signal based upon a comparison of a phase of the delayed multiphase clock signal with a phase of the reference clock signal.

These and other features, aspects, and embodiments are described below in the section entitled "Detailed Description."

BRIEF DESCRIPTION OF THE DRAWINGS

Features, aspects, and embodiment are described in conjunction with the attached drawings, in which.

DETAILED DESCRIPTION

Figure 1:
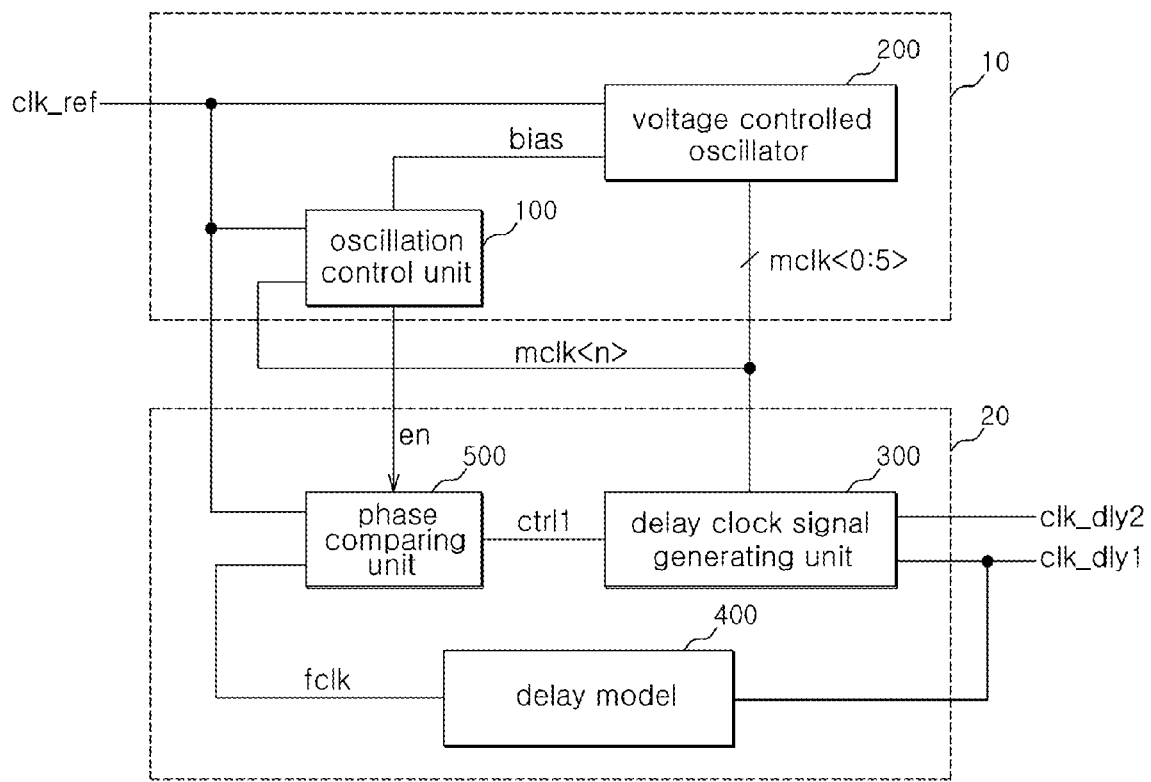
FIG. 1 is a schematic block diagram of an exemplary DLL circuit according to one embodiment.

FIG. 1 is a schematic block diagram of an exemplary DLL circuit according to one embodiment. In FIG. 1, the DLL circuit 1 can be configured to include a multiphase clock signal generating unit 10 and a multiphase clock signal selecting unit 20.

The multiphase clock signal generating unit 10 can be configured to produce a plurality of multiphase clock signals 'mclk<0:5>' by delaying a reference clock signal 'clk_ref', and to control the plurality of the multiphase clock signals 'mclk<0:5>' in order that the frequency of the plurality of the multiphase clock signals 'mclk<0:5>' is substantially the same as the frequency of the reference clock signal 'clk_ref'. In addition, The multiphase clock signal generating unit 10 can be configured to produce an enable signal 'en' when the frequency of the plurality of the multiphase clock signals 'mclk<0:5>' is substantially the same as the frequency of the reference clock signal 'clk_ref'. Here, the reference clock signal 'clk_ref' can be a signal obtained by converting an external clock signal through an input buffer.

In FIG. 1, the multiphase clock signal generating unit 10 can include an oscillation control unit 100 and a voltage controlled oscillator 200. The oscillation control unit 100 can produce a bias voltage 'bias' and the enable signal 'en' by comparing the frequency of the reference clock signal 'clk_ref' with the frequency of one of the plurality of the multiphase clock signals 'mclk<0:5>'. Hereinafter, the oscillation control unit 100 will be described in a case where a first multiphase clock signal 'mclk<0>' is input. Accordingly, when the frequency of the reference clock signal 'clk_ref' is higher than that of the first multiphase clock signal 'mclk<0>', the oscillation control unit 100 can increase the bias voltage 'bias' and provide the increased bias voltage 'bias' to the voltage controlled oscillator 200. Conversely, when the frequency of the reference clock signal 'clk_ref' is lower than the frequency of the first multiphase clock signal 'mclk<0>', the oscillation control unit 100 can decrease the bias voltage 'bias' and provide the decreased bias voltage 'bias' to the voltage controlled oscillator 200. In addition, when the frequency of the reference clock signal 'clk_ref' is substantially the same as the frequency of the first multiphase clock signal 'mclk<0>', the oscillation control unit 100 can maintain the voltage level of the bias voltage 'bias' with the activation of the enable signal 'en'.

The voltage controlled oscillator 200 can be configured to control an oscillation frequency by forming different amounts of time delay based upon the bias voltage 'bias'. Then, the voltage controlled oscillator 200 can delay the received reference clock signal 'clk_ref' by a unit delay time, and produce the plurality of the multiphase clock signals 'mclk<0:5>'. The clock frequency, which can be oscillated by the voltage controlled oscillator 200, can be controlled based on the bias voltage 'bias' supplied from the oscillation control unit 100. For example, the voltage controlled oscillator 200 can produce a clock signal having a fast frequency, i.e., a high frequency, when the bias voltage 'bias' is increased. In addition, the voltage controlled oscillator 200 can produce a clock signal having a slow frequency, i.e., a low frequency, when the bias voltage 'bias' is decreased. Accordingly, the voltage controlled oscillator 200 can produce the plurality of the multiphase clock signals 'mclk<0:5>' having substantially the same frequency as the reference clock signal 'clk_ref', but each of the plurality of the multiphase clock signals 'mclk<0:5>' can have the phase difference of the unit delay time.

When the enable signal 'en' is enabled, the multiphase clock signal selecting unit 20 can delay one of the plurality of the multiphase clock signals 'mclk<0:5>' for a predetermined time. In addition, the multiphase clock signal selecting unit 20 can compare the delayed multiphase clock signal with the reference clock signal 'clk_ref', and then, the multiphase clock signal selecting unit 20 can produce, as a first delayed clock signal 'clk_dly1', a multiphase clock signal, which is one of the plurality of the multiphase clock signals 'mclk<0:5>' and of which the phase accords with the reference clock signal 'clk_ref'.

In FIG. 1, the multiphase clock signal selecting unit 20 can include a delay clock signal generating unit 300, a delay model 400, and a phase comparing unit 500. The delay clock signal generating unit 300 can produce the first delayed clock signal 'clk_dly1' using at least one multiphase clock signal from the plurality of the multiphase clock signals 'mclk<0:5>' having substantially the same frequency as the reference clock signal 'clk_ref', in response to a first control signal 'ctrl1'.

For application to a DLL circuit, a delay model 400 can be set up to execute a delay operation correspondent to a delay time caused by an internal circuit in a semiconductor memory apparatus. For example, the delay model 400 can output a feedback clock signal 'fclk' by delaying the first delayed clock signal 'clk_dly1' that can be produced by the delay clock signal generating unit 300, for a predetermined time.

In FIG. 1, the phase comparing unit 500 can be activated in response to the enable signal 'en'. When the phase comparing unit 500 is activated, the feedback clock signal 'fclk' can be compared with the reference clock signal 'clk_ref' to produce the first control signal 'ctrl1'. For example, presuming that the delay clock signal generating unit 300, which can receive the first control signal 'ctrl1', produces a second multiphase clock signal 'mclk<1>' of the plurality of the multiphase clock signals 'mclk<0:5>' at the initial time, the first delayed clock signal 'clk_dly1' can be output as the feedback clock signal 'fclk' because the first delayed clock signal 'clk_dly1' can be delayed by the delay model 400.

When the phase of the feedback clock signal 'fclk' leads the phase of the reference clock signal 'clk_ref', the delay clock signal generating unit 300 can output the first control signal 'ctrl1' in order that a third multiphase clock signal 'mclk<2>', which can lag behind the second multiphase clock signal 'mclk<1>', can be output. Conversely, when the phase of the feedback clock signal 'fclk' lags behind the phase of the reference clock signal 'clk_ref', the delay clock signal generating unit 300 can output the first control signal 'ctrl1' in order that the first multiphase clock signal 'mclk<0>', which leads the second multiphase clock signal 'mclk<1>', can be output as the first delayed clock signal 'clk_dly1'.

Figure 2:
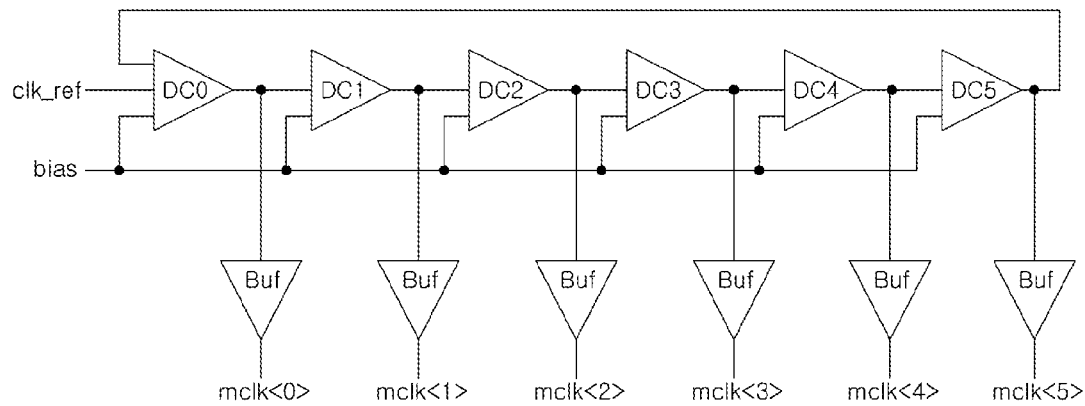
FIG. 2 is a schematic circuit diagram of an exemplary voltage controlled oscillator capable of being implemented in the circuit FIG. 1 according to one embodiment.

FIG. 2 is a schematic circuit diagram of an exemplary voltage controlled oscillator capable of being implemented in the circuit FIG. 1 according to one embodiment. In FIG. 2, the voltage controlled oscillator 200 can be configured to include a plurality of delay cells DC0 to DC5, each configured to receive the bias voltage 'bias' and reference clock signal 'clk_ref', and then produce the plurality of the multiphase clock signals 'mclk<0:5>'.

As shown in FIG. 2, the voltage controlled oscillator 200 can include six delay cells DC0 to DC5 and six buffers Buf. Each of the six delay cells DC0 to DC5 can delay an input signal by the unit delay so that each output signal of the six delay cells DC0 to DC5 can have substantially the same phase difference. In addition, each of the six delay cells DC0 to DC5 can be configured to receive the bias voltage 'bias', and can then adjust the frequency in order that the output signal can have substantially the same frequency as the reference clock signal 'clk_ref'. For example, the frequencies of the multiphase clock signals 'mclk<0:5>', which can be produced by making an amount of the delay different according to the supplied bias voltage 'bias', can be adjusted in order to be synchronous with the frequency of the reference clock signal 'clk_ref'.

The buffers Buf, which can be coupled to output terminals of the six delay cells DC0 to DC5, can produce the multiphase clock signals 'mclk<0:5>', respectively. Accordingly, where the voltage controlled oscillator 200 includes the six delay cells DC0 to DC5 and the six buffers Buf, the six multiphase clock signals 'mclk<0:5>' can be produced. For example, the first multiphase clock signal 'mclk<0>' of the six multiphase clock signals 'mclk<0:5>' can have the fastest phase, the second multiphase clock signal 'mclk<1>' thereof can have a phase that lags behind the first multiphase clock signal 'mclk<0>' by the unit delay time, for example, about one-sixth (⅙) of a time period, and the sixth multiphase clock signal 'mclk<5>' thereof can have the slowest phase. Here, although six delay cells and the six buffers are shown, the number of the delay cells and buffers are not limited to six. For example, it is possible to produce more multiphase clock signals by increasing the number of the delay cells and buffers.

Figure 3:
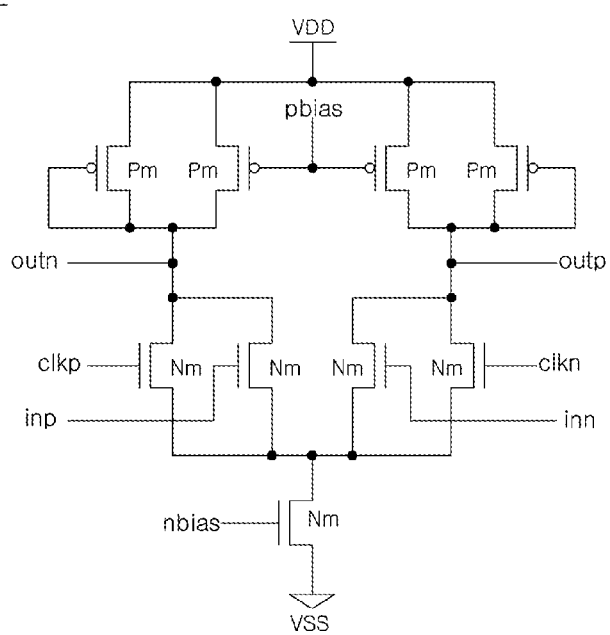
FIG. 3 is a schematic circuit diagram of an exemplary delay cell capable of being implemented in the oscillator of FIG. 2 according to one embodiment.

FIG. 3 is a schematic circuit diagram of an exemplary delay cell capable of being implemented in the oscillator of FIG. 2 according to one embodiment. In FIG. 3, it can be presumed that the reference clock signal 'clk_ref' can be configured to have a pair of clock signals 'clkp' and 'clkn', and that the clock signal 'clkp' can be approximately 180° (degrees) out of phase with the clock signal 'clkn'. The first delay cell DC0 can include PMOS transistor Pms that can be coupled in series to each other, and NMOS transistor Nms that can be coupled in series to each other. The delay cells DC0 to DC5 can have substantially the same configuration, except that the first delay cell DC0 can have the NMOS transistors Nms receiving a pair of the reference clock signals 'clkp' and 'clkn' and a pair of feedback signals 'inp' and 'inn'. In addition, the second to sixth delay cells DC1 to DC5 can have NMOS transistors Nms respectively receiving an output signal from the delay cell at the previous stage.

The first delay cell DC0 can increase or decrease the clock frequency by adjusting an amount of time delay according to a pair of bias voltages 'pbias' and 'nbias'. Here, the pair of bias voltages 'pbias' and 'nbias' can be in inverse proportion to each other. For example, when the bias voltage 'pbias' is increased, the bias voltage 'nbias' can be decreased in proportion to the bias voltage 'pbias'.

Figure 4:
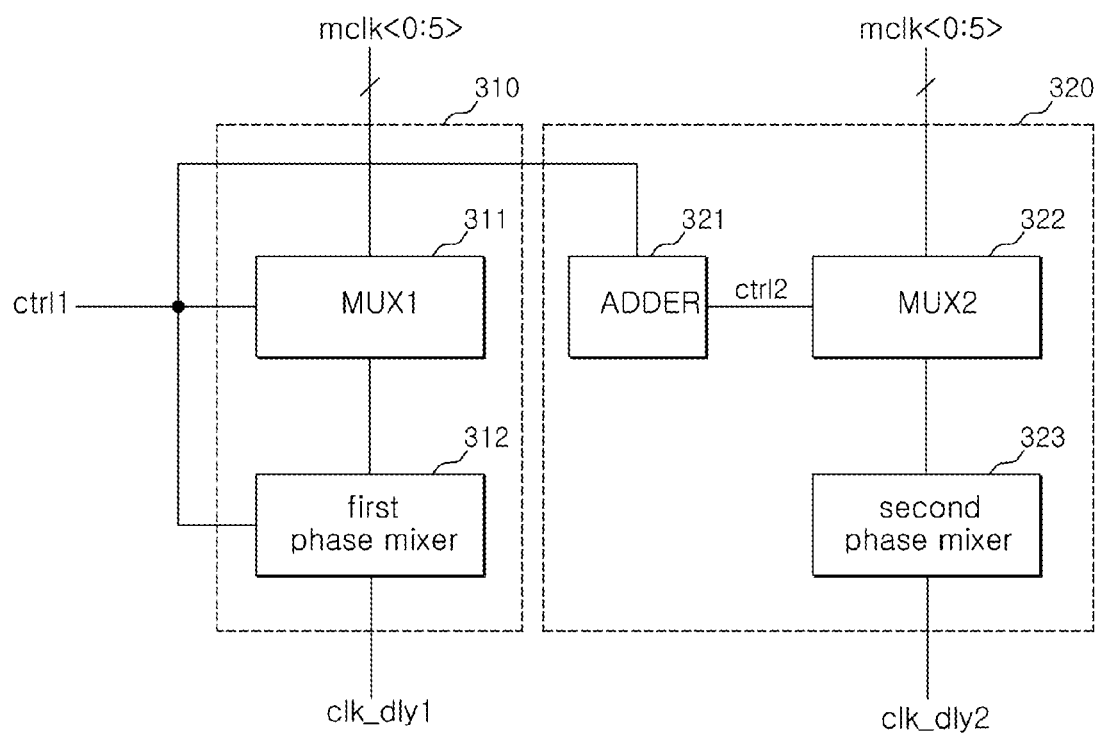
FIG. 4 is a schematic block diagram of an exemplary delay clock signal generating unit capable of being implemented in the circuit of FIG. 1 according to one embodiment.

FIG. 4 is a schematic block diagram of an exemplary delay clock signal generating unit capable of being implemented in the circuit of FIG. 1 according to one embodiment. In FIG. 4, the delay clock signal generating unit 300 can include a first output unit 310, which can include a first multiplexing unit (MUX1) 311 and a first phase mixer 312. The first multiplexing unit 311 can be configured to output one from the plurality of the multiphase clock signals 'mclk<0:5>' in response to the control signal 'ctrl1'. The first phase mixer 312 can minutely control an output signal of the first multiplexing unit 311 in response to the first control signal 'ctrl1'.

For example, when the first multiplexing unit 311 outputs the first multiphase clock signal 'mclk<0>' in response to the first control signal 'ctrl1', the first multiphase clock signal 'mclk<0>' can be input into the first phase mixer 312. Here, the first phase mixer 312 can select an arbitrary phase between the first multiphase clock signal 'mclk<0>' and the second multiphase clock signal 'mclk<1>'. For example, the first phase mixer 312, which can receive the first multiphase clock signal 'mclk<0>', can produce signals having an arbitrary phase between the first multiphase clock signal 'mclk<0>' and the second multiphase clock signal 'mclk<1>', as the first delayed clock signal 'clk_dly1'.

In FIG. 4, the delay clock signal generating unit 300 can further include a second output unit 320 having an adder 321 and a second multiplexing unit (MUX2) 322. In addition, the second output unit 320 can include a second phase mixer 323. The adder 321 can be configured to receive the first control signal 'ctrl1', and then produce a second control signal 'ctrl2'. For example, when the first multiphase clock signal 'mclk<0>' is output in response to the first control signal 'ctrl1', the fourth multiphase clock signal 'mclk<3>' can be output through the adder 321 in response to the second control signal 'ctrl2'.

The second multiplexing unit 322 can output at least one of the plurality of the multiphase clock signals 'mclk<0:5>' in response to the second control signal 'ctrl2'. Here, the second multiplexing unit 322 can have substantially the same configuration as the first multiplexing unit 311.

The second phase mixer 323 can be configured to execute substantially the same function as the first phase mixer 312. For example, when the second multiplexing unit 322 outputs the fourth multiphase clock signal 'mclk<3>', the second phase mixer 323 can produce signals having an arbitrary phase between the fourth multiphase clock signal 'mclk<3>' and the fifth multiphase clock signal 'mclk<4>', as the second delayed clock signal 'clk_dly2', in response to the second control signal 'ctrl2'. Here, the delayed clock signals 'clk_dly1' and 'clk_dly2' can be produced, in the multiphase signals, by providing the adder 321, the second mixer 322, and the second phase mixer 323.

Figure 5:
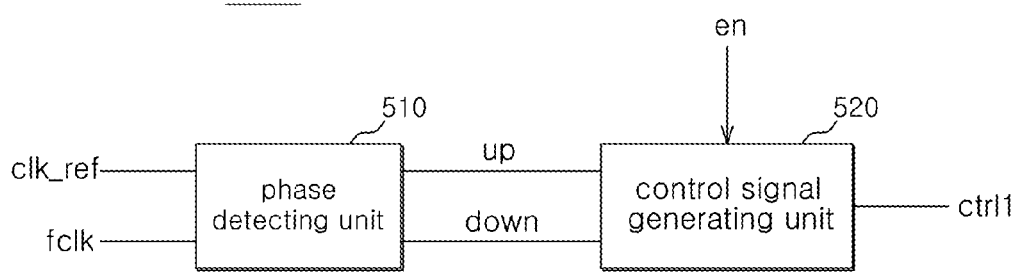
FIG. 5 is a schematic block diagram of an exemplary phase comparing unit capable of being implemented in the circuit of FIG. 1 according to one embodiment.

FIG. 5 is a schematic block diagram of an exemplary phase comparing unit capable of being implemented in the circuit of FIG. 1 according to one embodiment. In FIG. 5, the phase comparing unit 500 can include a phase detecting unit 510 and a control signal generating unit 520.

The phase detecting unit 510 can compare the reference clock signal 'clk_ref' with the feedback clock signal 'fclk' that can be produced by delaying the delayed clock signal 'clk_dly' from the delay clock signal generating unit 300 for a predetermined time through the delay model 400. In addition, the phase detecting unit 510 can compare the reference clock signal 'clk_ref' with the feedback clock signal 'fclk', and can enable a down signal 'down' when the feedback clock signal 'fclk' leads the reference clock signal 'clk_ref' in phase. Conversely, the phase detecting unit 510 can enable an up signal 'up' when the feedback clock signal 'fclk' lags behind the reference clock signal 'clk_ref' in phase.

The up signal 'up' and the down signal 'down' can be pulse signals that can be enabled at a high level. Furthermore, the phase detecting unit 510 can repeatedly produce the up signal 'up' and the down signal 'down' according to the phase difference between the feedback clock signal 'fclk' and the reference clock signal 'clk_ref'. For example, when the reference clock signal 'clk_ref' lags behind in phase the feedback clock signal 'fclk' by one-sixth of the time period, the up signal 'up' can be issued once. When the reference clock signal 'clk_ref' lags behind in phase the feedback clock signal 'fclk' by one-third of the time period, the up signal 'up' can be issued twice. The first delayed clock signal 'clk_dly1', which can synchronize with the reference clock signal 'clk_ref' in phase, can be rapidly issued by repeatedly generating the up signal 'up' and the down signal 'down' according to the phase difference.

In FIG. 5, the control signal generating unit 520 can produce the first control signal 'ctrl1' which is one of up-counted or down-counted in response to the up signal 'up' and the down signal 'down'. For example, the control signal generating unit 520 can be implemented by a counter that can produce the first control signal 'ctrl1' by carrying out the up-counting and down-counting operations in response to the up signal 'up' and the down signal 'down', respectively. Presuming that the counter is a 3-bit counter to output a 3-bit signal, eight signals can be output from --000--to--111--. When the control signal generating unit 520 produces the first control signal 'ctrl1' of --000-- in response to the enable signal 'en' at the initial time of the activation, the first control signal 'ctrl1' of --010-- can be produced and output if the up signal 'up' is issued twice, wherein thereafter the first control signal 'ctrl1' of --001-- can be produced and output if the down signal 'down' is issued once.

In FIG. 4, the first multiplexing unit 311 can output one of the plurality of the multiphase clock signals 'mclk<0:5>' according to the first control signal 'ctrl1'. For example, the first multiplexing unit 311 can be configured to output the plurality of the multiphase clock signals 'mclk<0:5>' in a one-by-one correspondence in such a manner that the first multiphase clock signal 'mclk<0>' can be output when the first control signal 'ctrl1' of --000-- is input and the second multiphase clock signal 'mclk<1>' is output when the first control signal 'ctrl1' of --001'-- is input. Although the first multiplexing unit 311 produces one multiphase clock signal, the first multiplexing unit 311 can be configured to output two or more multiphase clock signals at once.

In FIG. 4, the adder 321 can be configured to produce a signal that can be produced by further up-counting three times the first control signal 'ctrl1' that can be produced by the control signal generating unit 520 (in FIG. 5). For example, when the control signal generating unit 311 produces the first control signal 'ctrl1' of --000--, the adder 321 can receive the first control signal 'ctrl1' of --000-- can produce the second control signal 'ctrl2' of --001--. Accordingly, the second multiplexing unit 322 can output one of the plurality of multiphase clock signals 'mclk<0:5>' in response to the second control signal 'ctrl2'. For example, presuming that the first control signal 'ctrl1' is --000--, the first multiplexing unit 311 can output the first multiphase clock signal 'mclk<0>', and the second multiplexing unit 322, which can receive the second control signal 'ctrl2' of --011--, can output the fourth multiphase clock signal 'mclk<3>'. Where the voltage controlled oscillator 200 (in FIG. 2) produces the six multiphase clock signals 'mclk<0:5>', the output signal of the first multiplexing unit 311 can be about 90° (degrees) out of phase with the output signal of the second multiplexing unit 322.

The first and second phase mixers 312 and 323 can produce the first and second delayed clock signals 'clk_dly1' and 'clk_dly2' by minutely adjusting the phase of the first and fourth multiphase clock signals 'mclk<0>' and 'mclk<3>' output from the first and second multiplexing units 311 and 322 in response to the first and second control signals 'ctrl1' and 'ctrl2', respectively.

If additional inverters are provided to the output terminal of the first output unit 310 and the second output unit 320, then four delayed clock signals, i.e., the first delayed clock signal 'clk_dly1', the second delayed clock signal 'clk_dly2' (that can be about 90° (degrees) out of phase with the first delayed clock signal 'clk_dly1'), a clock signal (that can be about 180° (degrees) out of phase with the first delayed clock signal 'clk_dly1' by inverting the first delayed clock signal 'clk_dly1' through an inverter), and a clock signal (that can be about 270° (degrees) out of phase with the first delayed clock signal 'clk_dly1' by inverting the second delayed clock signal 'clk_dly2' through an inverter), can be produced.

An exemplary operation of the DLL circuit 1 will be described with reference to FIGS. 1 to 5.

The voltage controlled oscillator 200 produces the first to sixth multiphase clock signals 'mclk<0:5>' by receiving the reference clock signal 'clk_ref', and delays the received reference clock signal 'clk_ref' for a unit delay time. Then, one of the first to sixth multiphase clock signals 'mclk<0:5>' is fed back to the oscillation control unit 100. For example, when the first multiphase clock signal 'mclk<0>' is input into the oscillation control unit 100, the oscillation control unit 100 compares the first multiphase clock signal 'mclk<0>' with the reference clock signal 'clk_ref' and then adjusts the voltage level of the bias voltage 'bias' that is input into the voltage controlled oscillator 200. When the frequency of the first multiphase clock signal 'mclk<0>' is lower than the frequency of the reference clock signal 'clk_ref', the voltage controlled oscillator 200 produces the first to sixth multiphase clock signals 'mclk<0:5>' at the higher frequency by increasing the voltage level of the bias voltage 'bias'. When the frequency of the first multiphase clock signal 'mclk<0>' having produced by the voltage controlled oscillator 200 is synchronized with the frequency of the reference clock signal 'clk_ref', the oscillation control unit 100 maintains the voltage level of the bias voltage 'bias' and then enables the enable signal 'en'.

The enable signal 'en' activates the phase comparing unit 500. The control signal generating unit 520 of the phase comparing unit 500 is initialized by the received enable signal 'en', and then produce the first control signal 'ctrl1' of --000--. Next, the first output unit 310 outputs the first multiphase clock signal 'mclk<0>' as the first delayed clock signal 'clk_dly1' in response to the first control signal 'ctrl1'. Here, the first delayed clock signal 'clk_dly1' is delayed by the delay model 400.

Next, the delayed feedback clock signal 'fclk' is input into the phase detecting unit 510. The phase detecting unit 510 produces the up signal 'up' or the down signal 'down' by detecting the phases of the reference clock signal 'clk_ref' and the feedback clock signal 'fclk'. For example, when phase of the feedback clock signal 'fclk' leads the reference clock signal 'clk_ref' by one-sixth of the time period, the up signal 'up' is issued once.

Then, the control signal generating unit 520 produces, as the first control signal 'ctrl1', a signal of --001-- that is up-counted once in response to the up signal 'up'. Next, the adder 321 produces, as the second control signal 'ctrl2', a signal of --100-- that is up-counted three times from the first control signal 'ctrl1'. Accordingly, the first multiplexing unit 311 produces the second multiphase clock signal 'mclk<1>', as the first delayed clock signal 'clk_dly1', in response to the first control signal 'ctrl1' and the second multiplexing unit 322 produces the fifth multiphase clock signal 'mclk<4>', as the second delayed clock signal 'clk_dly2', in response to the second control signal 'ctrl2'. Here, when additional inverters are provided to the output terminal of the first and second multiplexing units 311 and 322, the clock signals, i.e., the first delayed clock signal 'clk_dly1') that is in synchronization with the reference clock signal 'clk_ref'), the second delayed clock signal 'clk_dly2' (that is about 90° (degrees) out of phase with the first delayed clock signal 'clk_dly1'), a clock signal (that is about 180° (degrees) out of phase with the first delayed clock signal 'clk_dly1' by inverting the first delayed clock signal 'clk_dly1' through an inverter), and a clock signal (that is about 270° (degrees) out of phase with the first delayed clock signal 'clk_dly1' by inverting the second delayed clock signal 'clk_dly2' through an inverter) can all be produced. Here, the four clock signals are exemplary, wherein the number of multiphase clock signals can be variously produced by an additional adder and multiplexing unit.

Accordingly, the locking time can be reduced by producing the plurality of the multiphase clock signals, which are synchronized with the reference clock signal, and selectively output one clock signal that is in synchronization with the reference clock signal. As a result, current consumption can be reduced and harmonic locking problems can be solved.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A DLL circuit, comprising:
a multiphase clock signal generating unit configured to produce a plurality of multiphase clock signals by delaying a reference clock signal for a unit delay time and to produce an enable signal that is enabled when one of the plurality of the multiphase clock signals synchronizes with the reference clock signal at a frequency; and
a multiphase clock signal selecting unit configured to delay one of the plurality of the multiphase clock signals for a predetermined time in response to a first control signal, to compare a phase of a delayed multiphase clock signal with a phase of the reference clock signal, and to output one of the plurality of the multiphase clock signals as a delayed clock signal,
wherein a phase of the delayed clock signal synchronizes with the phase of the reference clock signal when the enable signal is enabled.

2. The DLL circuit of claim 1, wherein the multiphase clock signal generating unit includes:
an oscillation control unit configured to produce a bias voltage and the enable signal by comparing the frequency of the reference clock signal with the frequency the one of the plurality of the multiphase clock signals; and
a voltage controlled oscillator configured to produce the plurality of the multiphase clock signals each of which has a phase difference between each other by the unit delay time by adjusting an oscillation frequency according to the bias voltage.

3. The DLL circuit of claim 2, wherein the oscillation control unit increases or decreases a voltage level of the bias voltage by comparing the frequency of the reference clock signal with the frequency of the one of the plurality of the multiphase clock signals.

4. The DLL circuit of claim 2, wherein the oscillation control unit enables the enable signal when the one of the plurality of the multiphase clock signals synchronizes with the reference clock signal at the frequency.

5. The DLL circuit of claim 2, wherein the voltage controlled oscillator includes:
a plurality of delay cells, each of the delay cells having an amount of delay adjusted by the bias voltage; and
a plurality of buffers, each coupled to each of the plurality of delay cells, producing the plurality of the multiphase clock signals.

6. The DLL circuit of claim 1, wherein the multiphase clock signal selecting unit includes:
a delay clock signal generating unit configured to receive the plurality of the multiphase clock signals and to produce a delayed clock signal in response to the first control signal;
a delay model configured to delay the delayed clock signal for the predetermined time and to produce a feedback clock signal; and
a phase comparing unit configured to produce the first control signal by comparing the reference clock signal with the feedback clock signal.

7. The DLL circuit of claim 6, wherein the delay clock signal generating unit includes a first multiplexing unit to output the one of the plurality of the multiphase clock signals in response to the first control signal.

8. The DLL circuit of claim 7, wherein the delay clock signal generating unit further includes a first phase mixer to adjust a phase of the multiphase clock signal that is output from the first multiplexing unit in response to the first control signal.

9. The DLL circuit of claim 7, wherein the delay clock signal generating unit further includes:
an adder configured to receive the first control signal and to produce a second control; and
a second multiplexing unit to output the one of the plurality of the multiphase clock signals in response to an output signal of the adder.

10. The DLL circuit of claim 9, wherein the delay clock signal generating unit further includes a second phase mixer to adjust a phase of the multiphase clock signal that is output from the second multiplexing unit in response to the second control signal.

11. The DLL circuit of claim 6, wherein the phase comparing unit includes:
a phase detecting unit configured to produce one of an up-signal and a down-signal by comparing the reference clock signal with the feedback clock signal; and
a control signal generating unit configured to produce the first control signal in response to the up-signal and the down-signal having been activated by the enable signal.

12. The DLL circuit of claim 11, wherein the control signal generating unit is activated by the enable signal and produces the first control signal based on numbers of one of the up-signal and down-signal that are enabled.

13. A DLL circuit, comprising:
a voltage controlled oscillator configured to receive a bias voltage and to produce a plurality of multiphase clock signals by delaying a clock signal for a unit delay time, the clock signal is oscillated at substantially a same frequency as a reference clock signal;
a delay clock signal generating unit configured to receive the plurality of the multiphase clock signals and to produce a delayed clock signal in response to a first control signal;
a delay model configured to receive and delay the delayed clock signal for a predetermined time and to produce a feedback clock signal; and
a DLL control unit configured to produce the bias voltage by comparing a phase of the reference clock signal with a phase of one of the multiphase clock signals at a frequency and to produce the first control signal by comparing the feedback clock signal with the reference clock signal.

14. The DLL circuit of claim 13, wherein the voltage controlled oscillator includes:
a plurality of delay cells, each of the delay cells have an amount of delay being adjusted by the bias voltage; and
a plurality of buffers, each coupled to one of the plurality of delay cells, to produce the plurality of the multiphase clock signals.

15. The DLL circuit of claim 13, wherein the delay clock signal generating unit includes a first multiplexing unit to output one of the plurality of the multiphase clock signals in response to the first control signal.

16. The DLL circuit of claim 15, wherein the delay clock signal generating unit further includes a first phase mixer to adjust a phase of the one of the plurality of multiphase clock signals that is output from the first multiplexing unit in response to the first control signal.

17. The DLL circuit of claim 13, wherein the delay clock signal generating unit further includes:
an adder configured to receive the first control signal and to produce a second control; and
a second multiplexing unit to output one of the plurality of the multiphase clock signals in response to an output signal of the adder.

18. The DLL circuit of claim 17, wherein the delay clock signal generating unit further includes a second phase mixer to adjust a phase of the one of the plurality of multiphase clock signals that is output from the second multiplexing unit in response to the second control signal.

19. The DLL circuit of claim 13, wherein the DLL control unit includes:
an oscillation control unit configured to produce the bias voltage and an enable signal by comparing a frequency of the reference clock signal with a frequency of one of the plurality of the multiphase clock signals; and
a phase comparing unit configured to produce the first control signal by comparing the feedback clock signal with the reference clock signal being activated by the enable signal.

20. The DLL circuit of claim 19, wherein the oscillation control unit increases or decreases a voltage level of the bias voltage by comparing the frequency of the reference clock signal with the frequency of the one of the plurality of the multiphase clock signals.

21. The DLL circuit of claim 19, wherein the oscillation control unit enables the enable signal when the one of the plurality of the multiphase clock signals synchronizes with the reference clock signal at the frequency.

22. The DLL circuit of claim 19, wherein the phase comparing unit includes:
a phase detecting unit configured to produce one of an up-signal and a down-signal by comparing the reference clock signal with the feedback clock signal; and
a control signal generating unit configured to produce the first control signal in response to the up-signal and the down-signal being activated by the enable signal.

23. The DLL circuit of claim 22, wherein the control signal generating unit is activated by the enable signal and produces the first control signal based on numbers of one of the up-signals and the down-signals that are enabled.

24. A memory device, comprising:
a DLL circuit having a multiphase clock signal generating unit and a multiphase clock signal selecting unit,
wherein the multiphase clock signal generating unit produces a plurality of multiphase clock signals and an enable signal that is enabled when one of the plurality of the multiphase clock signals synchronizes with a reference clock signal at a frequency, and
wherein the multiphase clock signal selecting unit delays one of the plurality of the multiphase clock signals for a predetermined time to output a delayed clock signal based upon a comparison of a phase of the delayed multiphase clock signal with a phase of the reference clock signal.

25. The memory device of claim 24, wherein a phase of the delayed clock signal synchronizes with the phase of the reference clock signal when the enable signal is enabled.

26. The memory device of claim 24, wherein the multiphase clock signal generating unit includes:
an oscillation control unit configured to produce a bias voltage and the enable signal by comparing the frequency of the reference clock signal with the frequency the one of the plurality of the multiphase clock signals; and
a voltage controlled oscillator configured to include a plurality of delay cells, each of the delay cells have an amount of delay being adjusted by the bias voltage, and a plurality of buffers, each coupled to one of the plurality of delay cells, to produce the plurality of the multiphase clock signals.

27. The memory device of claim 26, wherein the oscillation control unit increases or decreases a voltage level of the bias voltage by comparing the frequency of the reference clock signal with the frequency of the one of the plurality of the multiphase clock signals.

28. The memory device of claim 26, wherein the oscillation control unit enables the enable signal when the one of the plurality of the multiphase clock signals synchronizes with the reference clock signal at the frequency.

* * * * *